United States Patent
Qian (10) Patent No.: US 12,150,328 B2
(45) Date of Patent: Nov. 19, 2024

(54) DISPLAY PANEL MOTHERBOARD AND METHOD FOR MANUFACTURING A DISPLAY PANEL

(71) Applicant: Shenzhen China Star Optoelectronics Semiconductor Display Technology Co., Ltd., Guangdong (CN)

(72) Inventor: Jiajia Qian, Guangdong (CN)

(73) Assignee: SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 186 days.

(21) Appl. No.: 17/624,037

(22) PCT Filed: Dec. 22, 2021

(86) PCT No.: PCT/CN2021/140614
§ 371 (c)(1),
(2) Date: Dec. 30, 2021

(87) PCT Pub. No.: WO2023/108772
PCT Pub. Date: Jun. 22, 2023

(65) Prior Publication Data
US 2023/0200109 A1   Jun. 22, 2023

(30) Foreign Application Priority Data
Dec. 16, 2021   (CN) .......................... 202111546613.1

(51) Int. Cl.
*H01L 51/52*   (2006.01)
*H01L 51/56*   (2006.01)
(Continued)

(52) U.S. Cl.
CPC .......... *H10K 50/84* (2023.02); *H10K 59/873* (2023.02); *H10K 71/00* (2023.02); *H10K 71/851* (2023.02)

(58) Field of Classification Search
CPC ............... H10K 50/84–846; H10K 59/87–874
See application file for complete search history.

(56) References Cited

U.S. PATENT DOCUMENTS

2018/0364522 A1   12/2018   Yamaguchi et al.
2019/0363296 A1*  11/2019   Wang ................. H10K 50/8445
(Continued)

FOREIGN PATENT DOCUMENTS

CN   105633281 A   6/2016
CN   108400257 A   8/2018
(Continued)

OTHER PUBLICATIONS

Machine translation, Miyamoto, WIPO Pat. Pub. No. WO2020213103A1, translation date: Jun. 28, 2024, Clarivate Analytics, all pages. (Year: 2024).*
(Continued)

*Primary Examiner* — Victoria K. Hall
(74) *Attorney, Agent, or Firm* — Rivka Friedman (57) ABSTRACT

An embodiment of the application discloses a display panel motherboard and a method for manufacturing a display panel. The display panel motherboard includes a plurality of panel areas and a cutting area located between the panel areas. The display panel motherboard further includes a substrate, a display function layer, a peeling film layer, and an encapsulation layer. In particular, the display function layer is disposed on the substrate and includes a plurality of display unit sections, of which one display unit section is formed within one panel area. The peeling film layer is located within the cutting area. The encapsulation layer can (Continued)

be patterned as a consequence of peeling off the pre-formed peeling film layer without a photomask.

11 Claims, 5 Drawing Sheets

(51) Int. Cl.
*H10K 50/84* (2023.01)
*H10K 59/80* (2023.01)
*H10K 71/00* (2023.01)

(56) References Cited

U.S. PATENT DOCUMENTS

2020/0168848 A1* 5/2020 Jung .................. H10K 59/1201
2024/0215430 A1* 6/2024 Liu ........................ H10K 71/80

FOREIGN PATENT DOCUMENTS

| CN | 109449114 A | 3/2019 | |
|---|---|---|---|
| CN | 109860418 A | 6/2019 | |
| CN | 109962180 A | 7/2019 | |
| CN | 210325859 U | 4/2020 | |
| CN | 112154712 A | 12/2020 | |
| WO | WO-2020090053 A1 * | 5/2020 | ............. H05B 33/10 |
| WO | WO-2020213103 A1 * | 10/2020 | ............. H05B 33/10 |

OTHER PUBLICATIONS

Machine translation, Shuto, WIPO Pat. Pub. No. WO2020090053A1, translation date: Jun. 28, 2024, Clarivate Analytics, all pages. (Year: 2024).*

* cited by examiner

DISPLAY PANEL MOTHERBOARD AND METHOD FOR MANUFACTURING A DISPLAY PANEL

CROSS REFERENCE TO RELATED APPLICATIONS

The disclosure is a US national phase application based upon an International Application No. PCT/CN2021/140614, filed on Dec. 22, 2021, titled "DISPLAY PANEL MOTHERBOARD AND METHOD FOR MANUFACTURING A DISPLAY PANEL", which claims priority to Chinese patent application No. 202111546613.1, titled "DISPLAY PANEL MOTHERBOARD AND METHOD FOR MANUFACTURING A DISPLAY PANEL", filed with the National Intellectual Property Administration on Dec. 16, 2021, which is incorporated by reference in the present application in its entirety.

BACKGROUND OF DISCLOSURE

1. Field of Disclosure

This application relates to the field of display technology, and specifically to a display panel motherboard and a method for manufacturing a display panel.

2. Description of Related Art

The active metal used to form the metal cathode in organic electroluminescent diodes (OLED) devices is very sensitive to water vapor and oxygen in the air, and reacts very easily with permeated water vapor, which in turn affects the electric charge injection. Therefore, packaging technology is very important for OLED devices.

Currently, OLED devices have a variety of packaging methods, such as thin-film encapsulation (TFE), glass encapsulation, glass frit powder encapsulation, and other methods. Among them, the most commonly used is the TFE method, that is, the use of chemical vapor deposition (CVD) and inkjet printing (IJP) technology for OLED device packaging. The encapsulation method has the advantage of a simple process and can maintain the light and thin structure characteristics of the package object.

Most of the current inorganic films in OLED TFE packages are prepared by plasma enhanced chemical vapor deposition (PECVD) with photomasks, in which photomasks are very expensive and have a shorter service life. Additionally, the photomask has production deviations and may have alignment deviations, shadow effects, and thermal deformation problems in use, resulting in large deviations between the actual film formation position and the design, etc. Therefore, there is an urgent need for a display panel motherboard structure that can reduce the use of photomasks and the corresponding display panel fabrication method.

SUMMARY

An embodiment of the application provides a display panel motherboard and a method for manufacturing a display panel to solve the technical problem of providing a display panel motherboard structure capable of reducing the use of a photomask and a corresponding method of making a display panel.

To solve the above problem, the technical solution provided by this application is as follows.

An embodiment of the application provides a display panel motherboard comprising a plurality of panel areas spaced apart and a cutting area disposed between the panel areas, the display panel motherboard comprising:

a substrate;

a display function layer, disposed on the substrate and comprising a plurality of display unit sections, of which one display unit section being provided within one panel area;

a peeling film layer disposed on the substrate and located within the cutting area;

an encapsulation layer disposed on the substrate, the display function layer, and the peeling film layer and covering the display function layer and the peeling film layer.

In an embodiment, the peeling film layer is provided with a peeling slot formed on a side of the peeling film layer, and the peeling slot is disposed on the side of the peeling film layer near the substrate.

In an embodiment, in a direction perpendicular to the substrate, the peeling film layer has an inverted trapezoidal vertical cross-section, and the peeling slot has a wedge-shaped vertical cross-section.

In an embodiment, an angle between a side of the peeling film layer and the substrate is less than 60° or equal to 60°, and a depth H of the peeling slot ranges from 0.1 um to 2 um.

In an embodiment, in the direction perpendicular to the substrate, a contour of the vertical cross-section of the peeling film layer is inverted trapezoidal and the vertical cross-section of the peeling slot is rectangular.

In an embodiment, a depth H of the peeling slot ranges from 0.1 um to 2 um.

In an embodiment, the material of the peeling film layer comprises at least one of ceramic and organic material.

In an embodiment, the peeling film layer comprises a first material layer and a second material layer provided in layers, wherein the material of the first material layer comprises a positively charged ceramic, and the material of the second material layer comprises a negatively charged organic material.

In an embodiment, the display unit section comprises a control device layer and an organic light-emitting layer disposed on the control device layer.

The display panel motherboard includes a control device connection layer disposed within the cutting area and disposed on the substrate, the peeling film layer being disposed on the control device connection layer and disposed within the cutting area.

In an embodiment, the peeling film layer comprises at least one first sub-layer extending in a first direction and at least one second sub-layer extending in a second direction, wherein the first direction and the second direction are at a predetermined angle, the first sub-layer and the second sub-layer intersect at a corner position at which a peeling transition sub-layer is formed and connects the first sub-layer and the second sub-layer.

In an embodiment, a peeling slot is formed on a side of the peeling film layer, and the peeling slot is disposed on the side of the peeling film layer near the substrate; the display unit section includes a control device layer and an organic light-emitting layer disposed on the control device layer;

the display panel motherboard includes a control device connection layer located within the cutting area and disposed on the substrate, the peeling film layer being disposed on the control device connection layer and located within the cutting area.

In an embodiment, in a direction perpendicular to the substrate, the peeling film layer has an inverted trapezoidal vertical cross-section, and the peeling slot has a wedge-shaped vertical cross-section.

In an embodiment, an angle between a side of the peeling film layer and the substrate is less than 60° or equal to 60°, and a depth H of the peeling slot ranges from 0.1 um to 2 um.

In an embodiment, a peeling slot is formed on a side of the peeling film layer, and the peeling slot is disposed on the side of the peeling film layer near the substrate; and material of the peeling film layer comprises at least one of ceramic or organic material.

In an embodiment, the peeling film layer comprises a first material layer and a second material layer provided in layers, wherein the material of the first material layer comprises a positively charged ceramic, and the material of the second material layer comprises a negatively charged organic material.

The application further provides a method for manufacturing a display panel using a display panel motherboard, comprising the steps of:

providing the display panel motherboard as described above;

stripping the peeling film layer from the display panel motherboard to pattern the encapsulation layer on the peeling film layer.

cutting the display panel motherboard in the cutting area to obtain a display panel;

wherein the display panel motherboard comprises a plurality of panel areas spaced apart and a cutting area located between the panel areas, the display panel motherboard comprising:

a substrate;

a display function layer disposed on the substrate and comprising a plurality of display unit sections, one display unit section being provided within one panel area;

a peeling film layer disposed on the substrate and located within the cutting area; and an encapsulation layer disposed on the substrate, the display function layer, and the peeling film layer and covering the display function layer and the peeling film layer.

In an embodiment, material of the peeling film layer comprises at least one of ceramic or organic material.

In an embodiment, the peeling film layer comprises a first material layer and a second material layer provided in layers, wherein the material of the first material layer comprises a positively charged ceramic, and the material of the second material layer comprises a negatively charged organic material.

In an embodiment, the peeling film layer comprises at least one first sub-layer extending in a first direction and at least one second sub-layer extending in a second direction, wherein the first direction and the second direction are at a predetermined angle, and the first sub-layer and the second sub-layer intersect at a corner position at which a peeling transition sub-layer is formed and connects the first sub-layer and the second sub-layer.

In an embodiment, the step of providing a display panel motherboard as described, comprises:

providing a substrate, wherein the display panel motherboard comprises a plurality of panel areas spaced apart and a cutting area disposed between the panel areas;

forming a display function layer within the panel area on the substrate, the display function layer comprising a plurality of display unit sections, of which one the display unit section is formed within one the panel area;

forming a peeling film layer within the cutting area on the substrate;

forming an encapsulation layer covering the display function layer and the peeling film layer on the substrate, the display function layer and the peeling film layer.

Useful Effects:

The application provides a display panel motherboard, by pre-forming a peeling film layer in the cutting area on the substrate before making the encapsulation layer, and then forming the encapsulation layer on the peeling film layer, making it possible to realize the patterning process of the encapsulation layer without a photomask at a later stage when the patterning process of the encapsulation layer is carried out, only by peeling off the pre-formed peeling film layer, and the peeling film layer takes away part of the encapsulation layer on a corresponding position of the peeling film layer during the peeling process, enabling the patterning production of the encapsulation layer without a photomask. It avoids a series of production deviations caused by the photomask itself, alignment deviation, shadow effect and thermal deformation caused by the operation of the photomask and avoids device scratches caused by the use of the photomask, and also effectively reduces the production cost of the display panel motherboard.

DETAILED DESCRIPTION OF EMBODIMENTS

The application provides a display panel motherboard and a method for manufacturing a display panel. In order to make the purpose, technical solutions and effects of the present application clearer and more explicit, the present application is described in further detail hereinafter with reference to the accompanying drawings and by way of example. It should be understood that the specific embodiments described herein are intended to explain the present application only and are not intended to limit the present application.

Figure 1:
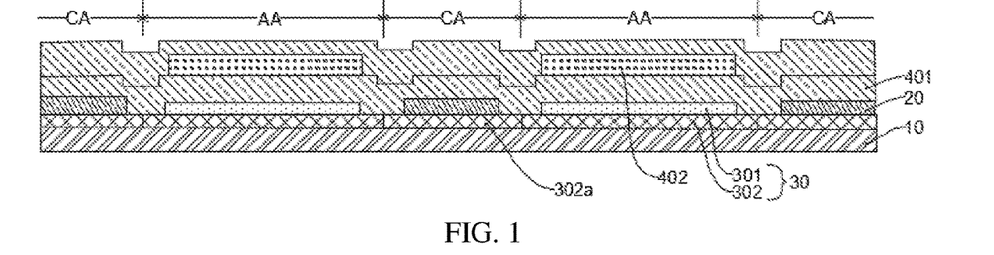
FIG. 1 illustrates a schematic diagram of the structure of a display panel motherboard provided by an embodiment of the application.

With reference to FIGS. 1, 2, 3 and 6, an embodiment of the application provides a display panel motherboard, comprising a plurality of panel areas AA spaced apart and cutting areas CA disposed between the panel areas AA, the display panel motherboard comprising:

a substrate 10.

Specifically, as shown in FIG. 1, the substrate 10 may be a flexible substrate 10 or a rigid substrate 10, specifically being made of polyimide, glass, or organic composite material.

Figure 2:
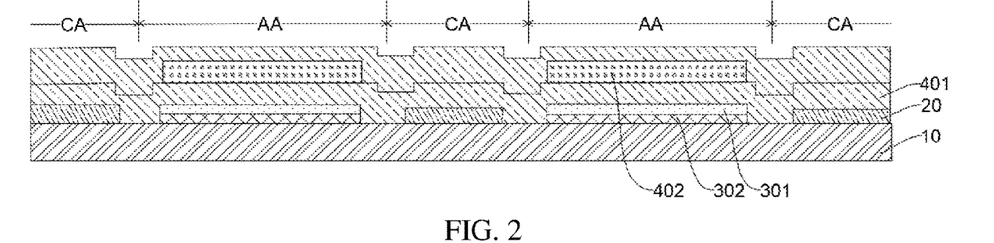
FIG. 2 illustrates a schematic diagram of the structure of another display panel motherboard provided by an embodiment of the application.

Specifically, as shown in FIG. 2, the substrate 10 may have a control device motherboard formed on the substrate 10 that controls the substrate 10, comprising a control device layer 302 and a control device connection layer 302a. A portion of the control device motherboard within the panel area AA comprises the control device layer 302.

Specifically, the cutting area CA has a cutting line, and subsequent cutting of the display panel motherboard along the cutting line may be performed to obtain a plurality of display panels.

A display function layer is disposed on the substrate 10 and comprises a plurality of display unit sections 30, of which one display unit section 30 is formed within one panel area AA.

Specifically, as shown in FIG. 1, the plurality of display unit part 30 can be a control device layer 302 and organic light-emitting layer 301 stacked, where the control device layer 302 is disposed on the substrate 10.

A peeling film layer 20 is disposed on the substrate 10 and located within the cutting area CA.

Figure 5:
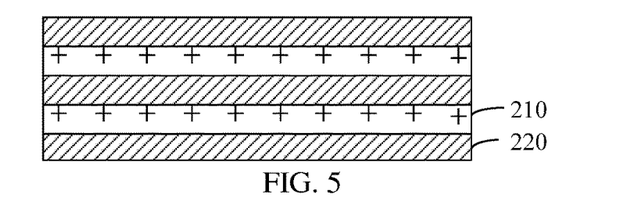
FIG. 5 illustrates a schematic diagram of the structure of a peeling film layer of a composite material provided by an embodiment of the application.
Figure 6:
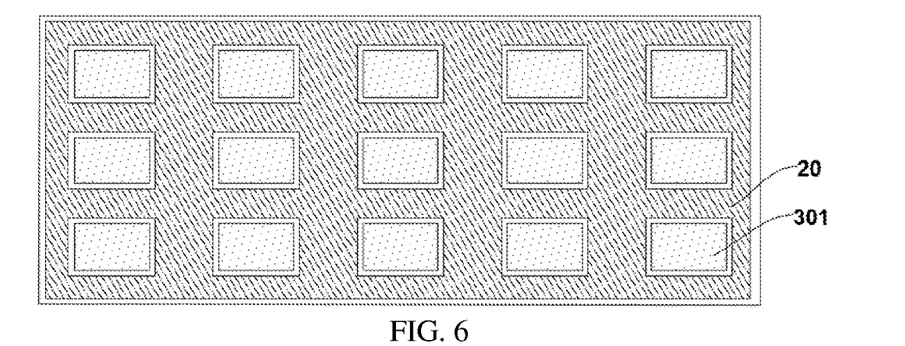
FIG. 6 illustrates a top view of a display panel motherboard provided by an embodiment of the application.

Specifically, the peeling film layer 20 is made of a material that is easily peeled from the substrate 10. The material of the peeling film layer 20 comprises ceramic or organic material or may be a composite material of ceramic and organic materials, which, for example, as shown in FIG. 5, may be a stacked structure formed by a laminated structure of positively charged ceramic and negatively charged organic material.

Specifically, the peeling film layer 20 is disposed within a cutting area CA, and an orthographic projection of the peeling film layer 20 on the substrate 10 falls within an orthographic projection of the cutting area CA on the substrate 10.

An encapsulation layer is disposed on the substrate 10, the display function layer, and the peeling film layer 20 and covers the display function layer and the peeling film layer 20.

Specifically, the material of the encapsulation layer includes organic material and/or inorganic material.

Specifically, the encapsulation layer can be stacked in the order of an inorganic material layer 401, an organic material layer 402, and an inorganic material layer 401 to form a composite package film layer structure for better packaging effects. An orthographic projection of the organic layer on the substrate 10 coincides with the panel area AA.

Specifically, the encapsulation layer covers at least part of the peeling film layer 20. Furthermore, the encapsulation layer can be prepared by whole-surface coating. For example, when the encapsulation layer is a structure with sequential stacking of the inorganic material layer 401, organic material layer 402, and inorganic material layer 401, the inorganic material layer 401 can be made by any one of the processes such as a vapor deposition method of plasma enhanced chemistry, a sputtering method, etc. The organic material layer 402 can be produced by any one of the processes of ink jet printing, silk screen printing, and slit coating.

Specifically, when the display panel motherboard needs to be cut by a subsequent slitting process, the peeling film layer 20 can be separated from the substrate 10 by mechanical means (including but not limited to mechanical means), and the encapsulation layer above the peeling film layer 20 within the cutting area CA is also slit, achieving the purpose of being able to pattern the encapsulation layer without using a photomask.

It can be understood that the present embodiment provides a display panel motherboard in which the peeling film layer 20 is formed in the cutting area CA on the substrate 10 before fabricating the encapsulation layer, and then the encapsulation layer is formed on the peeling film layer 20, so that the encapsulation layer can be patterned as a consequence of peeling off the pre-formed peeling film layer 20 without a photomask during the subsequent patterning process performed for the encapsulation layer.

The above embodiment makes it possible to avoid using a photomask in the process of display panel packaging. Compared with products using a photomask, which has a short life span and is expensive, this embodiment applies a peeling film layer 20 at a lower cost. The photomask has intrinsic shortcomings of production deviations, alignment deviations, and the photomask is prone to thermal deformation, which can have a greater impact on the packaging accuracy. Since the photomask is not used, this embodiment does not easily introduce small metal particles, reducing the risk of scratches on the display panel and improving the production yield of the product. Since the photomask also generates shadow effects, this embodiment does not use a photomask, so boundaries can be set according to a specific range of the peeling film layer 20 when CVD is performed, thus facilitating the manufactured display panel to have a narrower bezel and more beautiful appearance, and higher user experience is expected.

Figure 3:
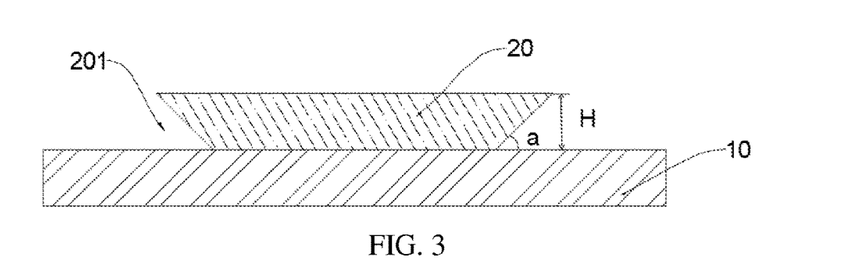
FIG. 3 illustrates a vertical cross-sectional view of a peeling film layer provided by an embodiment of the application.
Figure 4:
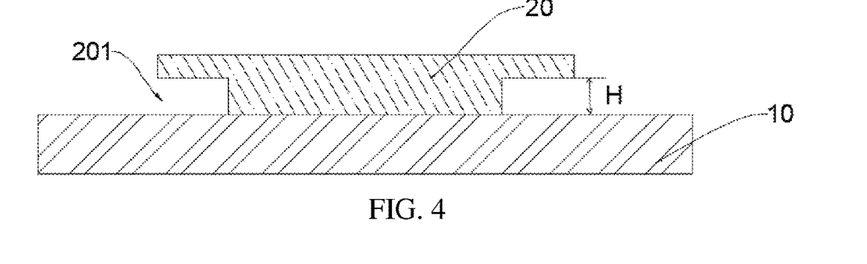
FIG. 4 illustrates a vertical cross-sectional view of another peeling film layer provided by an embodiment of the application.

In an embodiment, as shown in FIGS. 3 and 4, the peeling film layer 20 is provided with a peeling slot 201 formed on a side of the peeling film layer 20, and the peeling slot 201 is disposed on a side of the peeling film layer 20 near the substrate 10.

Specifically, the peeling slot 201 is formed at the edge of the peeling film layer 20 and near a side of the substrate 10, so that the side of the peeling film layer 20 forms an inwardly recessed structure, i.e., a gap is formed at the encapsulation layer near the peeling film layer 20, and the peeling film layer 20 and the encapsulation layer do not overlap each other. When the peeling film layer 20 is peeled off by mechanical means, the encapsulation layer breaks at the gap, reducing the difficulty of peeling the peeling film layer 20 and also reducing the risk of package failure due to uneven cracking of the encapsulation layer, improving the package effect of the display panel.

Specifically, the shape of the peeling slot 201 is not limited here, and its cross-section may be triangular or rectangular, preventing lapping between the peeling film layer 20 and the encapsulation layer.

It can be understood that by opening the peeling slot 201 on the side of the peeling film layer 20, a gap is formed at the encapsulation layer near the peeling film layer 20, and there is no lap between the peeling film layer 20 and the encapsulation layer. When the peeling film layer 20 is peeled by mechanical means, the encapsulation layer breaks at the gap, reducing the difficulty of peeling the peeling film layer 20, and also reducing the risk of packaging due to uneven cracking of the encapsulation layer, and improving packaging effects of the display panel.

In an embodiment, as shown in FIG. 3, in a direction perpendicular to the substrate 10, the peeling film layer 20 has an inverted trapezoidal vertical cross-section, and the peeling slot 201 has a wedge-shaped vertical cross-section.

Specifically, in the direction perpendicular to the substrate 10, the peeling film layer 20 has an inverted trapezoidal vertical cross-section, an angle a between a side of the peeling film layer 20 and the substrate 10 may be less than 60° or equal to 60°. The depth H of the peeling slot 201 may have a value in the range of 0.1 um<H<2 um.

It is to be noted that the depth H is the height of the peeling slot 201 in the direction perpendicular to the control substrate 10.

It can be understood that in order to make the peeling film layer 20 better peeled from the substrate 10 at a later stage and prevent the inorganic layer from forming an overlap structure at the edge of the peeling film layer 20 during the formation of the encapsulation layer, and further realize the non-destructive peeling of the encapsulation layer within the cutting area CA, an inwardly recessed peeling slot 201 is therefore formed at the edge of the peeling film layer 20 to improve the packaging of the encapsulation layer after the peeling layer is peeled.

In an embodiment, as shown in FIG. 4, in the direction perpendicular to the substrate 10, a contour of the peeling film layer 20 of the vertical cross-section are T-shape structure, and the peeling slot 201 of the vertical cross-section is rectangular.

Specifically, in the direction perpendicular to the substrate 10, the peeling film layer 20 has an inverted trapezoidal vertical cross-section, and the depth H of the peeling slot 201 can take a value in the range of 0.1 um<H<2 um.

It is to be noted that the depth H is the height of the peeling slot 201 in the direction perpendicular to the control substrate 10.

It can be understood that in order to make the peeling film layer 20 better peeled from the substrate 10 at a later stage and prevent the inorganic layer from forming an overlap structure at the edge of the peeling film layer 20 during formation of the encapsulation layer to further realize the non-destructive peeling of the encapsulation layer within the cutting area CA, an inwardly recessed peeling slot 201 is therefore formed at the edge of the peeling film layer 20 to improve the package quality of the encapsulation layer after the peeling layer is peeled.

In an embodiment, the material of the peeling film layer 20 comprises at least one of a ceramic and an organic material.

In one embodiment, as shown in FIG. 5, the peeling film layer 20 comprising a first material layer 210 and a second material layer 220 provided in layers. The material of the first material layer 210 comprises a positively charged ceramic, and the material of the second material layer 220 comprising a negatively charged organic material.

Specifically, the positively charged ceramic and negatively charged organic material are alternately set in layers, making the bonding between the peeling film layers 20 tighter. The peeling slots 201 are formed on the sides of the peeling film layers 20.

It can be understood that by using ceramic or organic material to make the peeling film layer 20, it can ensure that the peeling film layer 20 and the substrate 10 can be smoothly peeled off as a whole in the later preparation steps. Additionally, due to the characteristics of the material, the peeling film layer 20 intrinsically having a certain strength is not easy to be shattered during the peeling process and will not damage the display panel.

In an embodiment, as shown in FIG. 2, the display unit section 30 includes a control device layer 302 and an organic light-emitting layer 301 set on the control device layer 302.

The display panel motherboard includes a control device connection layer 302*a* disposed within the cutting area CA and disposed on the substrate 10, and the peeling film layer 20 is disposed on the control device connection layer 302*a* and within the cutting area CA.

Specifically, the display unit section 30 includes a control device layer 302. The control device layer 302 includes a plurality of control circuits, of which each control circuit corresponds to a panel area AA, wherein the organic light-emitting layer 301 is formed in the upper layer of the control circuit, each control circuit corresponds to and controls an organic light-emitting layer 301, to achieve a display and light-emitting function of the display panel in the panel area AA. The control circuit can be a TFT control circuit.

Specifically, the organic light-emitting layer 301 may include a laminated ITO transparent display electrode (anode), a hole injection layer, a hole transport layer, a light-emitting layer, an electron transport layer, an electron injection layer, and a metal electrode (cathode).

Specifically, the control device connection layer 302*a* and the control device layer 302 are provided in the same layer and formed by the same process. The peeling film layer 20 is disposed on the control device connection layer 302*a* and located in the cutting area CA.

Figure 7:
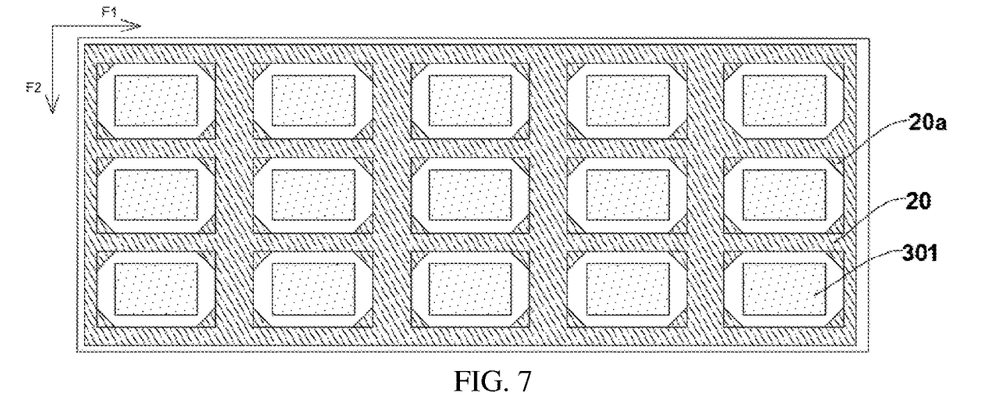
FIG. 7 illustrates a top view of another display panel motherboard provided by an embodiment of the application.

In one embodiment, as shown in FIG. 7, the peeling film layer 20 comprises at least one first sub-layer extending along a first direction F1 and at least one second sub-layer extending along a second direction F2. The first direction F1 and the second direction F2 is at a predetermined angle. The first sub-layer and the second sub-layer intersect at a corner location at which a peeling transition sub-layer is formed and connects the first sub-layer and the second sub-layer 20*a*.

Specifically, the peeling film layer 20 is located in the cutting area CA. A width of the first sub-layer and the second sub-layer is smaller than a width of the cutting area CA at a corresponding position. At the intersection of the first sub-layer and the second sub-layer, a transition sub-layer is provided. The peeling transition sub-layer 20*a* can be triangular. The peeling transition sub-layer 20*a*, the first sub-layer, and the second sub-layer are set in the same layer and formed in one piece.

It can be understood that by providing peeling transition sub-layer 20*a* at the intersection, the peeling film layer 20 can be peeled as a whole as much as possible during the mechanical peeling, dispersing a tearing force at the intersection of the first sub-layer and the second sub-layer, ameliorating the problem of cracking of the peeling film layer 20 in the peeling process caused by stress concentration at the intersection of the first sub-layer and the second sub-layer, and improving the peeling efficiency.

Figure 9:
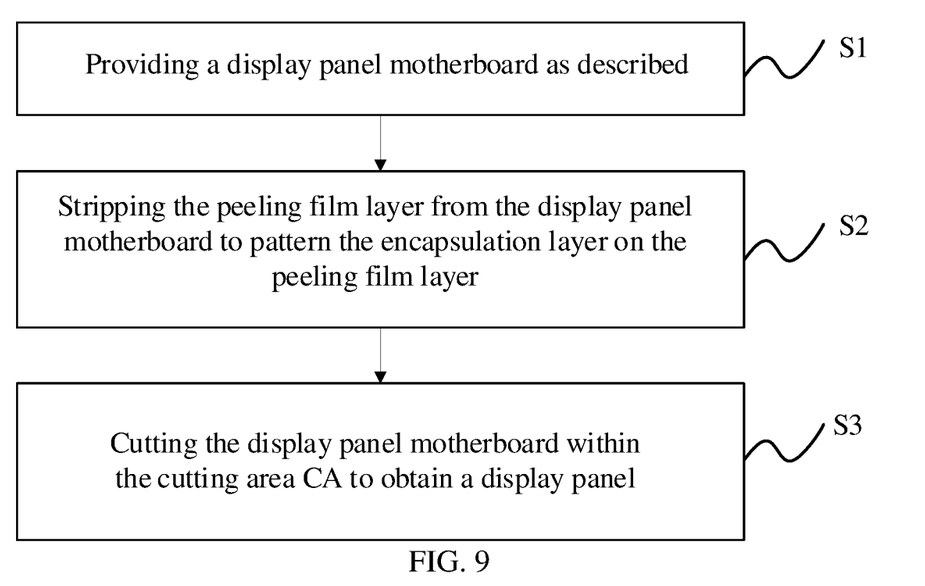
FIG. 9 illustrates a flowchart of a process for manufacturing a display panel provided by an embodiment of the application.

Additionally, an embodiment of the application provides a method for manufacturing a display panel, as shown in FIG. 9, using a display panel motherboard as described in any of the above embodiments, comprising the steps of:

S1: providing a display panel motherboard as described above;

S2: stripping the peeling film layer 20 from the display panel motherboard to pattern the encapsulation layer on the peeling film layer 20;

S3: cutting the display panel motherboard within the cutting area CA to obtain a display panel.

Specifically, the display panel motherboard includes a plurality of panel areas AA spaced apart and cutting areas CA located between the panel areas AA. In a subsequent slitting step, the display panel motherboard is cut along cutting lines within the cutting areas CA to slit the display panel motherboard into a plurality of display panels.

Specifically, peeling of the peeling film layer 20 may be performed mechanically.

As can be appreciated, using the display panel motherboard of the application for manufacturing a display panel allows encapsulation of the display panel to be processed without any photomask. Compared to the production method using photomask, which has a short life span and is expensive, this application realizes the patterning of the encapsulation layer by coating the peeling film layer 20 and mechanically peeling it at a later stage, which is cheaper. Considering the photomask has intrinsic shortcomings of production deviation, alignment deviation, and the photomask is prone to thermal deformation, which will have a greater impact on the precision of the package, this application uses the peeling film layer 20 to pattern the encapsulation layer, so that the precision of the manufactured display panel can be greatly improved. As the photomask is not used, this application will not easily introduce small metal particles, reducing the risk of the display panel being easily scratched in the production process, and improving the production yield of the product. Since the photomask also produces a shadow effect, this embodiment does not use a photomask, so the border of the display panel can be set according to the specific range of the peeling film layer 20 when CVD is performed, making the resulting slit display panel with a narrower border, a more beautiful appearance and a higher sense of user experience.

Figure 10:
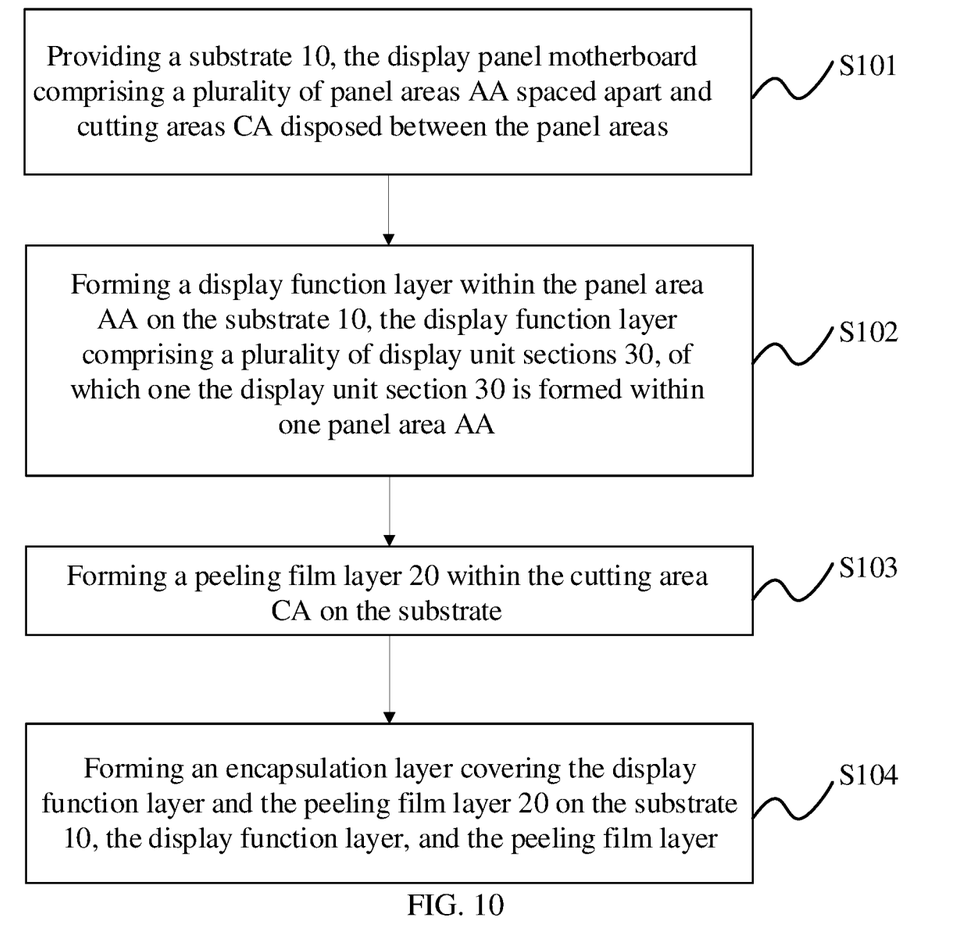
FIG. 10 illustrates a flowchart of a process for manufacturing a display panel motherboard provided by an embodiment of the application

In an embodiment, as shown in FIG. 10, the providing a display panel motherboard as described, comprises:

S101: providing a substrate 10, the display panel motherboard comprising a plurality of panel areas AA spaced apart and cutting areas CA disposed between the panel areas AA;

S102: forming a display function layer within the panel area AA on the substrate 10, the display function layer comprising a plurality of display unit sections 30, of which one the display unit section 30 is formed within one panel area AA;

S103: forming a peeling film layer 20 within the cutting area CA on the substrate 10;

S104: forming an encapsulation layer covering the display function layer and the peeling film layer 20 on the substrate 10, the display function layer, and the peeling film layer 20.

Figure 8A:
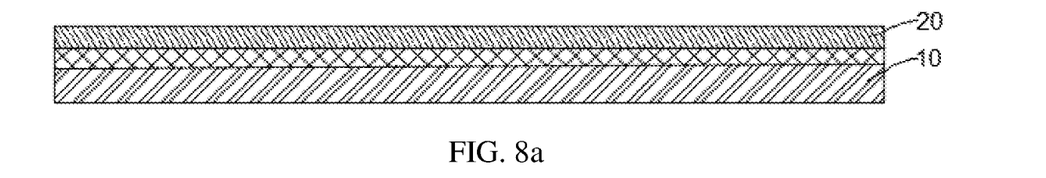
FIG. 8*a* illustrates a schematic diagram of a process for manufacturing a display panel motherboard provided by an embodiment of the application.
Figure 8B:
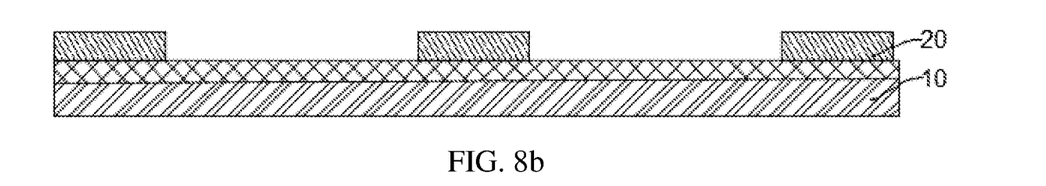
FIG. 8*b* illustrates a schematic diagram of a process for manufacturing a display panel motherboard provided by an embodiment of the application.
Figure 8C:
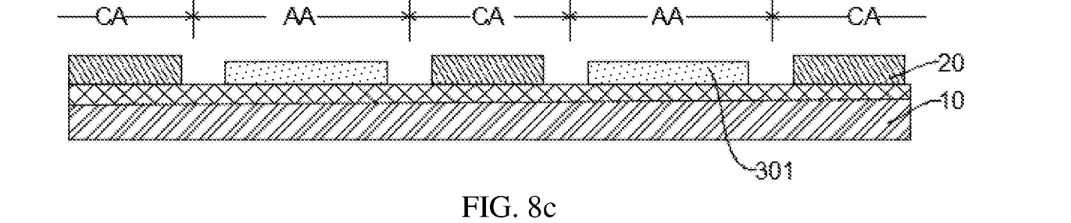
FIG. 8*c* illustrates a schematic diagram of a process for manufacturing a display panel motherboard provided by an embodiment of the application.
Figure 8D:
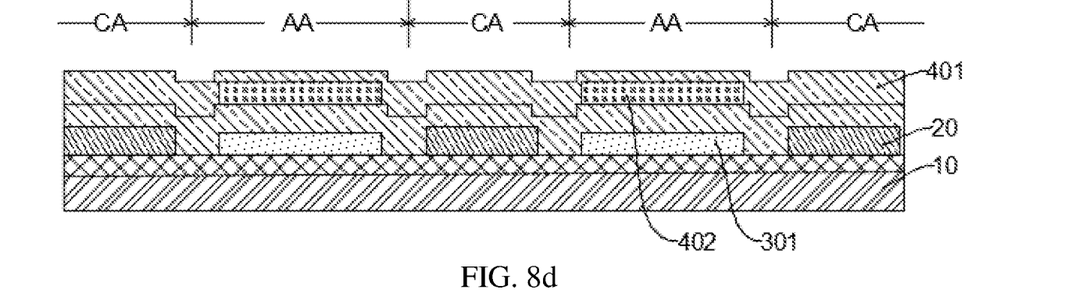
FIG. 8*d* illustrates a schematic diagram of the process of making a display panel motherboard provided by an embodiment of the application.
Figure 8E:
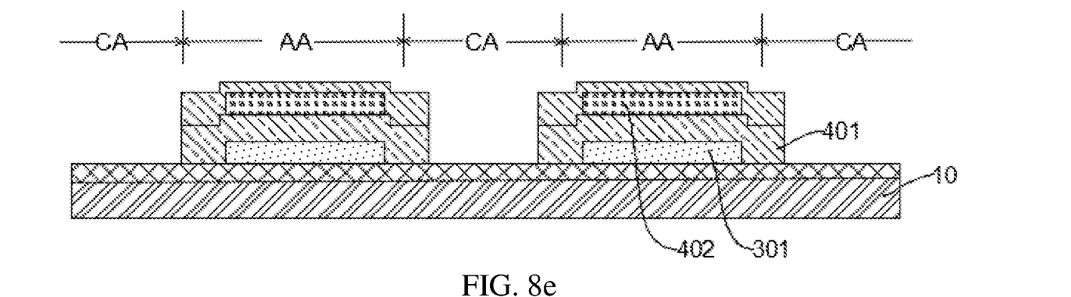
FIG. 8*e* illustrates a schematic diagram of a process for manufacturing a display panel motherboard provided by an embodiment of the application.

In another embodiment, as shown in FIG. 8a, FIG. 8b, FIG. 8c, FIG. 8d, and FIG. 8e, providing a display panel motherboard as described, comprises the steps of:

as shown in FIG. 8a, first forming a substrate 10 forming a control device motherboard on the substrate 10, and forming a prefabricated layer of peeling film layer 20 on the control device motherboard;

as shown in FIG. 8b, patterning the prefabricated layer of peeling film layer 20 to form a peeling film layer, wherein the peeling film layer is located within the cutting area CA, and exposing the substrate 10 in the panel areas AA;

as shown in FIG. 8c, forming an organic light-emitting layer 301 within the panel area AA on the substrate 10, having the organic light-emitting layer 301 and the peeling film layer 20 disposed in in the same layer;

as shown in FIG. 8d, forming an encapsulation layer on the entire surface of the substrate 10, wherein the encapsulation layer comprises an inorganic material layer 401 and an organic material layer 402, the organic material layer 402 is disposed on the organic light-emitting layer 301, the encapsulation layer covers the peeling film layer 20 and the organic light-emitting layer 301; and thus, obtaining the display panel motherboard of this application, and before carrying out the step of dividing the display panel motherboard to obtain the display panel, peeling off the peeling film layer by mechanical means as shown in FIG. 8e to obtain the display panel motherboard with the patterned encapsulation layer.

It can be understood that the display panel motherboard obtained by the technical means in this application has low cost, good packaging quality, high yield of manufactured display panel products, and more beautiful appearance. In this application, the display panel packaging process can be done without photomasks. Compared with the method for manufacturing of using photomasks, the life of photomasks is short, expensive, and the production cost is high, the embodiment uses the means of first coating the peeling film layer 20 and later peeling for patterning the upper encapsulation layer at a lower cost. The photomask has its intrinsic production deviation, alignment deviation, and the photomask is prone to thermal deformation, which will have a greater impact on the precision of the package. The embodiment uses the peeling film layer 20 to pattern the encapsulation layer, so that the precision of the product is greatly improved. Because the photomask is not used, this embodiment does not easily introduce small metal particles, which reduces the risk of scratches on the display panel and improves the production yield of the product. Since a photomask also produces a shadow effect, this embodiment does not use a photomask, when chemical vapor deposition is carried out, boundaries of a film layer obtained by chemical vapor deposition can be set according to a specific range of the peeling film layer 20, which makes the manufactured display panel with a narrower border, a more beautiful appearance and a higher sense of user experience.

In summary, the application provides a display panel motherboard in which a peeling film layer 20 is formed in advance in the cutting areas on the substrate prior to the production of the encapsulation layer. Subsequently, an encapsulation layer is formed on the peeling film layer 20, making it possible to pattern the encapsulation layer later without a photomask by peeling off the pre-formed peeling film layer 20, and the peeling film layer 20 takes away a portion of the encapsulation layer on corresponding positions in the peeling process. This enables the patterning of the encapsulation layer without a photomask, avoiding a series of production deviations caused by the photomask itself, alignment deviations, shadow effects and thermal deformation caused by the operation of the photomask, avoiding device scratches caused by the use of the photomask, and also effectively reducing the production cost of the display panel motherboard.

It is understood that to a person of ordinary skill in the art, equivalent substitutions or changes may be made in accordance with the technical solutions of this application and its inventive concept. All such changes or substitutions shall fall within the scope of protection of the claims appended to this application.

What is claimed is:

1. A display panel motherboard comprising a plurality of panel areas spaced apart and a cutting area located between the panel areas, the display panel motherboard comprising:
   a substrate;
   a display function layer disposed on the substrate and comprising a plurality of display unit sections, one display unit section being provided within one panel area;
   a peeling film layer disposed on the substrate and located within the cutting area, wherein a peeling slot is formed on a side of the peeling film layer, and the peeling slot is disposed on the side of the peeling film layer near the substrate; and
   an encapsulation layer disposed on the substrate, the display function layer, and the peeling film layer and covering the display function layer and the peeling film layer.

2. The display panel motherboard as claimed in claim 1, wherein in a direction perpendicular to the substrate, the peeling film layer has an inverted trapezoidal vertical cross-section, and the peeling slot has a wedge-shaped vertical cross-section.

3. The display panel motherboard as claimed in claim 2, wherein an angle between a side of the peeling film layer and the substrate is less than 60° or equal to 60°, and a depth H of the peeling slot ranges from 0.1 um to 2 um.

4. The display panel motherboard as claimed in claim 1, wherein in a direction perpendicular to the substrate, a contour of a vertical cross-section of the peeling film layer is T-shape structure and a vertical cross-section of the peeling slot is rectangular.

5. The display panel motherboard as claimed in claim 4, wherein a depth H of the peeling slot ranges from 0.1 um to 2 um.

6. The display panel motherboard as claimed in claim 1, wherein the display unit section includes a control device layer and an organic light-emitting layer disposed on the control device layer;
   the display panel motherboard includes a control device connection layer located within the cutting area and disposed on the substrate, the peeling film layer being disposed on the control device connection layer and located within the cutting area.

7. The display panel motherboard as claimed in claim 6, wherein in a direction perpendicular to the substrate, the peeling film layer has an inverted trapezoidal vertical cross-section, and the peeling slot has a wedge-shaped vertical cross-section.

8. The display panel motherboard as claimed in claim 7, wherein an angle between a side of the peeling film layer and the substrate is less than 60° or equal to 60°, and a depth H of the peeling slot ranges from 0.1 um to 2 um.

9. The display panel motherboard as claimed in claim 6, wherein in a direction perpendicular to the substrate, a contour of a vertical cross-section of the peeling film layer is T-shape structure and a vertical cross-section of the peeling slot is rectangular.

10. The display panel motherboard as claimed in claim 9, wherein a depth H of the peeling slot ranges from 0.1 um to 2 um.

11. The display panel motherboard as claimed in claim 1, wherein the peeling film layer comprises at least one first sub-layer extending in a first direction and at least one second sub-layer extending in a second direction, wherein the first sub-layer and the second sub-layer intersect at a corner position at which a peeling transition sub-layer is formed and connects the first sub-layer and the second sub-layer.

* * * * *